United States Patent
Lueders et al.

(10) Patent No.: US 11,031,933 B2
(45) Date of Patent: Jun. 8, 2021

(54) ENHANCEMENT MODE STARTUP CIRCUIT WITH JFET EMULATION

(71) Applicant: Texas Instruments Incorporated, Dallas, TX (US)

(72) Inventors: Michael Lueders, Freising (DE); Johan Strydom, Saratoga, CA (US); Cetin Kaya, Plano, TX (US); Maik Peter Kaufmann, Freising (DE)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/731,847

(22) Filed: Dec. 31, 2019

(65) Prior Publication Data
US 2020/0274530 A1    Aug. 27, 2020

Related U.S. Application Data

(60) Provisional application No. 62/809,165, filed on Feb. 22, 2019.

(51) Int. Cl.
| | |
|---|---|
| *H02M 1/08* | (2006.01) |
| *H03K 17/22* | (2006.01) |
| *H02M 1/36* | (2007.01) |
| *H02M 3/335* | (2006.01) |

(52) U.S. Cl.
CPC ............ *H03K 17/223* (2013.01); *H02M 1/08* (2013.01); *H02M 1/36* (2013.01); *H02M 3/33592* (2013.01)

(58) Field of Classification Search
CPC .......... H02M 1/08; H02M 1/088; H02M 1/32; H02M 1/36; H02M 3/156; H02M 3/33507; H02M 3/33523; H02M 3/33592; H03K 17/22; H03K 17/223
See application file for complete search history.

(56) References Cited

U.S. PATENT DOCUMENTS

| | | | |
|---|---|---|---|
| 6,947,272 B2* | 9/2005 | Daniels .............. | H03K 17/0822 361/93.7 |
| 7,450,361 B2* | 11/2008 | Ito ........................ | H03K 17/163 361/93.1 |
| 2007/0216383 A1* | 9/2007 | Al-Shyoukh ........... | G05F 1/468 323/280 |
| 2015/0162830 A1* | 6/2015 | Dong ...................... | H02M 1/36 323/271 |
| 2019/0123636 A1* | 4/2019 | Moallem ................. | G05F 1/618 |

OTHER PUBLICATIONS

"UCC28780 High Frequency Active Clamp Flyback Controller", Texas Instruments, UCC28780, SLUSD12A—Oct. 2017—Revised Feb. 2018, 68 pgs.

* cited by examiner

*Primary Examiner* — Matthew V Nguyen
(74) *Attorney, Agent, or Firm* — Mark Allen Valetti; Charles A. Brill; Frank D. Cimino

(57) ABSTRACT

A startup circuit includes an enhancement mode transistor with a drain coupled to a startup circuit input, a source coupled to a first node, and a gate coupled to a second node. The startup circuit includes a current limiting circuit that controls a current path between the second node and a startup circuit output node based on a current sense voltage signal representing a current through the enhancement mode transistor, and a voltage regulation circuit controls a voltage of the second node to regulate a startup circuit output voltage of the startup circuit output node.

20 Claims, 10 Drawing Sheets

ENHANCEMENT MODE STARTUP CIRCUIT WITH JFET EMULATION

REFERENCE TO RELATED APPLICATION

Under 35 U.S.C. § 119, this application claims priority to, and the benefit of, U.S. provisional patent application No. 62/809,165, entitled "High-Voltage JFET Emulation in E-Mode GAN for Start-Up", and filed on Feb. 22, 2019, the entirety of which is hereby incorporated by reference.

BACKGROUND

Certain electrical circuits are designed to start upon application of power, such as power supplies for device charging systems. In some cases, the applied power is in the form of a high voltage, and startup circuitry must have high voltage withstanding capabilities. High voltage start-up circuits often include a high-voltage depletion mode transistor, such a high voltage depletion mode transistor or junction field effect transistor (JFET). When power is initially applied, a JFET or depletion mode transistor can turn on without an auxiliary supply voltage. The JFET or depletion mode transistor is then used to charge a capacitor until an allowed value for the supply voltage is reached. The normally on transistor operates as a current source at start-up, and external circuitry disables the depletion mode transistor or JFET after startup for low leakage normal operation. Using an external depletion mode transistor or JFET is expensive in terms of cost and circuit area. However, integrating a depletion mode transistor or JFET in a low-mask count, enhancement mode, gallium nitride (GaN) fabrication process is difficult.

SUMMARY

A startup circuit and power conversion system are described, including an enhancement mode transistor, a current limiting circuit and a voltage regulation circuit. The enhancement mode transistor includes a drain, a source coupled to a first node, and a gate coupled to a second node. The current limiting circuit controls a current path between the second node and a startup circuit output node based on a current sense voltage signal representing a current through the enhancement mode transistor. The voltage regulation circuit controls a voltage of the second node to regulate a startup circuit output voltage of the startup circuit output node.

A power conversion system includes a supply input, a converter switch coupled to a switch node, a driver circuit having an output coupled to a control terminal of the converter switch, and a startup circuit. The startup circuit includes a startup circuit input coupled to the supply input or the switch node, and an enhancement mode transistor coupled in a first circuit path between the startup circuit input and a startup circuit output node, the enhancement mode transistor including a drain coupled to the startup circuit input, a source coupled to a first node, and a gate coupled to a second node. The startup circuit also includes a current limiting circuit to control a second current path between the second node and the startup circuit output node based on a current sense voltage signal of a resistor in the first circuit path to control an upper limit of a current of the first circuit path. The startup circuit also includes a voltage regulation circuit coupled to the startup circuit output node and the second node, and configured to control a voltage of the second node to regulate a startup circuit output voltage of the startup circuit output node.

A method is described including applying a rising voltage signal to a drain of an enhancement mode transistor to turn the enhancement mode transistor on to deliver a charging current to an output node to charge a capacitor. The method also includes controlling a gate voltage of the enhancement mode transistor to limit the charging current, blocking current flow from the output node to the gate of the enhancement mode transistor, and turning the enhancement mode transistor off in response to a voltage of the output node exceeding a threshold.

DETAILED DESCRIPTION

Figure 1:
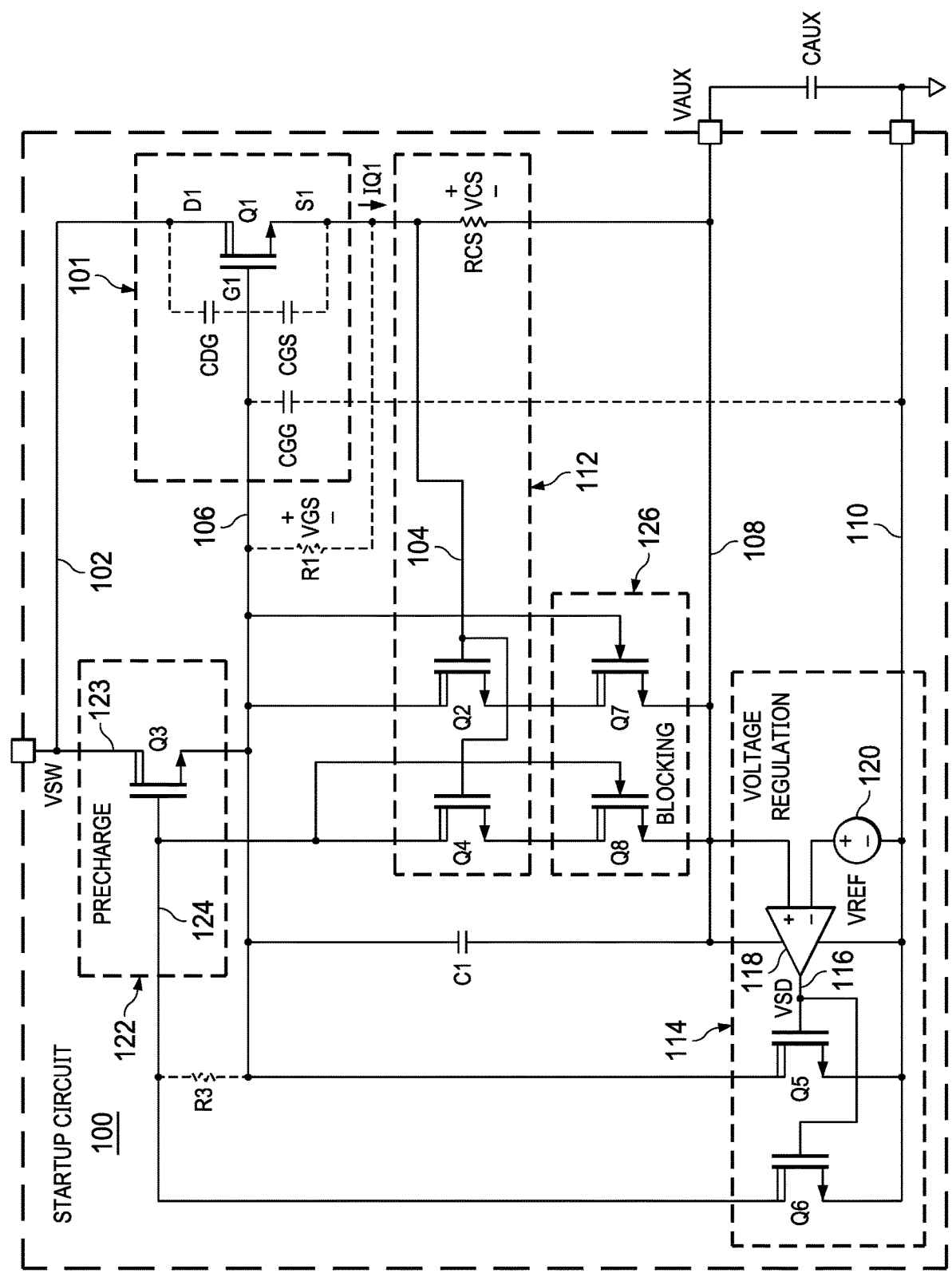
FIG. 1 is a schematic diagram of a startup circuit according to one embodiment.

In the drawings, like reference numerals refer to like elements throughout, and the various features are not necessarily drawn to scale. The term "couple" is used throughout the specification. The term may cover connections, communications, or signal paths that enable a functional relationship consistent with the description of the present disclosure. For example, if device A generates a signal to control device B to perform an action, in a first example device A is coupled to device B by direct connection, or in a second example device A is coupled to device B through intervening component C if intervening component C does not alter the functional relationship between device A and device B such that device B is controlled by device A via the control signal generated by device A.

Figure 2:
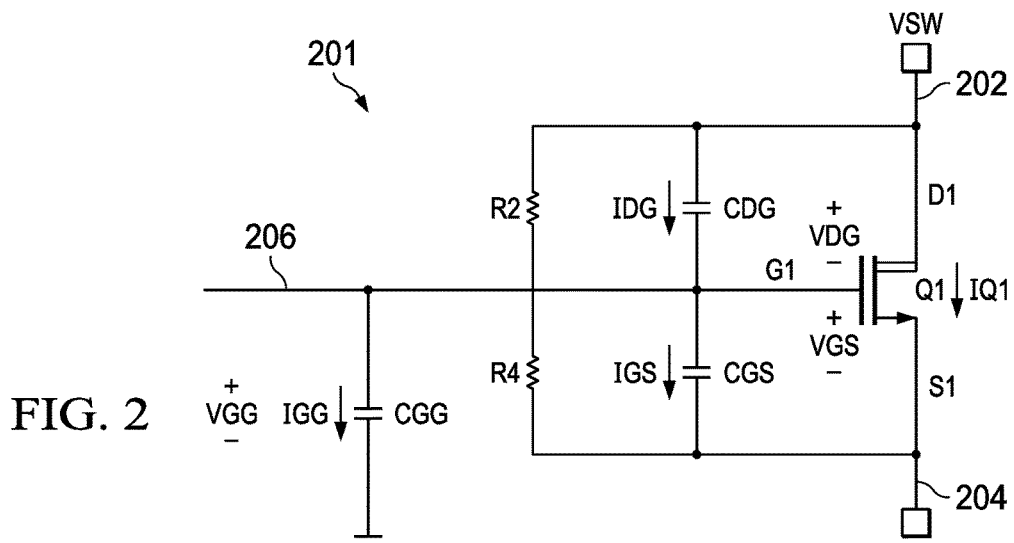
FIG. 2 is a simplified schematic diagram of an enhancement mode gallium nitride transistor in the startup circuit of FIG. 1.

Referring initially to FIGS. 1 and 2, FIG. 1 shows a startup circuit 100 with a high-voltage enhancement mode (E-mode) transistor 101 (Q1) to control startup of a host system. In one example, the startup circuit 100 is or includes an integrated circuit with pins or pads to electrically couple with conductive features of a host printed circuit board (PCB) to create a circuit with other electronic components. In one application, the startup circuit 100 is included in a switch mode power converter, such as a flyback converter. The transistor 101 acts as a current source at startup to establish a supply voltage for an active clamp flyback (ACF) controller, and the transistor 101 is disabled to reduce or mitigate leakage after startup during steady-state operation of the power converter. In one implementation, the power converter includes a rectifier circuit or other DC supply source coupled to a first terminal of a primary winding of a transformer, and a converter switch is coupled between the second terminal of the primary winding and a ground or reference node. The second terminal of the primary winding forms a switch node with a switch node voltage that rises in response to initial connection of the rectifier to an AC power source during startup. In steady-state operation, the controller operates the switch to transfer power to a secondary transformer winding, and a secondary side rectifier provides a DC output voltage signal to drive a load.

FIG. 1 shows an example implementation of the high voltage start-up circuit 100. The startup circuit includes the enhancement mode transistor Q1 (101), a current limiting circuit 112, a voltage regulation circuit 114 and a precharge circuit 122. The precharge circuit 122 includes a precharge circuit input 123 coupled to the startup circuit input 102 or to a supply node (not shown in FIG. 1) and a precharge circuit output coupled to the second node 106. The precharge circuit 122 includes a third transistor Q3 or a current source (e.g., FIG. 10 below) coupled between the precharge circuit input 123 and the second node 106 to provide a current to the second node 106. In the example of FIG. 1, the precharge circuit 122 provides a charge to the gate of the enhancement mode transistor Q1 to increase a gate-source voltage VGS of the enhancement mode transistor Q1. As the gate-source voltage VGS of the enhancement mode transistor Q1 continues to rise and a current IQ1 of the transistor Q1 increases. The example enhancement mode transistor 101 can be a Group III-V transistor, such as a gallium nitride (GaN) enhancement mode transistor Q1. The enhancement mode transistor Q1 includes a drain D1 coupled to a startup circuit input 102, a source Si coupled to a first node 104, and a gate G1 coupled to a second node 106. Due to a drain-gate capacitance CDG and gate-source capacitance CGS, a drain voltage increase of the enhancement mode transistor Q1 may cause its gate voltage to rise. As such, the enhancement mode transistor responds to the rise in gate charge (e.g., in response to a positive voltage slew-rate of a voltage VSW at the drain of the enhancement mode transistor). The rise in gate charge may lead to an increase in gate-source voltage. When the gate-source voltage VGS of Q1 is above the threshold voltage of the transistor Q1, the transistor Q1 turns on and Q1 conducts a current IQ1 to begin charging a capacitor CAUX connected to a startup circuit output 108. The charging current develops a startup circuit output voltage VAUX at the startup circuit output node 108. The ratio CDG/CGS of the enhancement mode transistor capacitances facilitates turn on of the enhancement mode transistor Q1 in response to a rising drain voltage.

The example of FIG. 1 also includes a precharge circuit 122 with a precharge transistor Q3, as well as a capacitor C1. In the example of FIG. 1, the capacitor C1 includes a first terminal connected to the second node 106, and a second terminal connected to the startup circuit output node 108. In other implementations, the capacitor C1 is omitted. The precharge circuit 122 provides a charge to the gate G1 of the enhancement mode transistor Q1 to turn the enhancement mode transistor Q1 on. The capacitor C1 is coupled between the gate of the enhancement mode transistor Q1 and the startup circuit output node 108. In this implementation, even if the rate of increase in the voltage VSW at the startup circuit input 102 is insufficient to turn Q1 on, the rising slope of VSW at the drain of the precharge circuit transistor Q3 turns Q3 on, which then charges the capacitor C1 and the gate-source capacitance CGS of the enhancement mode transistor Q1, which causes Q1 to turn on. The illustrated example including the precharge circuit 122 enhances the capability of the startup circuit 100 to turn the enhancement mode transistor Q1 on in response to a rising voltage VSW at the startup circuit input 102. In one example, the precharge transistor Q3 is smaller than the enhancement mode transistor Q1, and Q3 can turn on through charging from a rising voltage VSW faster than Q1. In certain applications, the rate of increase in the voltage VSW may be correlated to the frequency of an AC grid that supplies power to a rectifier coupled to the startup circuit input 102 (e.g., FIG. 11 below), and Q3 may turn on in conditions where Q1 alone would not. In this condition where the rate of increase in the voltage VSW is insufficient to create enough charge to turn the enhancement mode transistor Q1 on, the precharge transistor Q3 turns on to supply charge to the gate G1 to turn Q1 on. In another implementation, the precharge circuit 122 and the precharge transistor Q3 are omitted, and the enhancement mode transistor Q1 is turned on in response to the rising voltage VSW at the startup circuit input 102. FIG. 1 shows a resistor R3 coupled to the second node 106 and a third node 124 to represent parasitic gate-source leakage of the precharge transistor Q3.

The capacitor CAUX is connected between the startup circuit output node 108 and a reference node 110. In one example, the capacitor CAUX charges by current IQ1 conducted through the enhancement mode transistor Q1 to develop an auxiliary voltage, referred to herein as the startup circuit output voltage VAUX at the startup circuit output node 108. The reference node 110 in this implementation is a ground reference for the startup circuit 100 and a host power supply system (e.g., FIG. 11 below). In one implementation, the startup circuit output node 108 is connected by a diode to a main supply voltage node (e.g., to provide a supply voltage signal VDD), and a separate regulator circuit regulates the main supply voltage after the startup circuit output voltage VAUX reaches a predetermined amplitude, and provides a turn off signal to the startup circuit 100 to turn the enhancement mode transistor Q1 off. In this implementation, therefore, the startup circuit output voltage VAUX is an auxiliary supply voltage signal generated and sustained during startup operation, and the host power supply system operates in steady-state using the supply voltage signal VDD. In one example, the capacitor CAUX is external to the startup circuit 100. The capacitor CAUX sustains a startup circuit output voltage VAUX in response to the charging current IQ1 conducted by the enhancement mode transistor Q1.

The current limiting circuit 112 (e.g., labeled CURRENT LIMITER in FIG. 1) is coupled to the first node 104, the startup circuit output node 108, and the second node 106. The current limiting circuit 112 includes a first resistor RCS, with a first terminal coupled to the first node 104, and a second terminal coupled to the startup circuit output node 108. The current limiting circuit 112 also includes a second transistor Q2, with a drain coupled directly or indirectly to the second node 106, a source coupled to (e.g., connected to) the startup circuit output node 108, and a gate coupled to (e.g., connected to) the first node 104. In operation, the first terminal of the resistor RCS delivers a current sense voltage signal VCS to the gate of the second transistor Q2. The current sense voltage signal VCS causes the second transistor Q2 to control the voltage VGS of the gate G1 of the enhancement mode transistor Q1 to limit the drain-source current IQ1 of the enhancement mode transistor Q1. In one example, the current limiting circuit 112 includes a fourth transistor Q4. The fourth transistor Q4 includes a drain coupled to the third node 124, a source coupled to the startup circuit output node 108, and a gate coupled to the first node 104.

In operation, the current limiting circuit 112 limits the drain-source current IQ1 of the enhancement mode transistor Q1 to an upper limit set by the impedance of the current sense resistor RCS. The voltage regulation circuit 114 is coupled to the startup circuit output node 108, and the second node 106. The voltage regulation circuit 114 includes a voltage regulation output node 116, a comparator or an amplifier 118 (e.g., op-amp), and a voltage reference 120 that provides a non-zero reference voltage signal VREF. In addition, the example startup circuit 100 in FIG. 1 includes a precharge circuit 122 to help precharge the second node 106. The third transistor Q3 in this example includes a drain coupled to the drain D1 of the transistor Q1, a source coupled directly or indirectly to the second node 106, and a gate coupled to a third node 124.

In one example the current limiting circuit 112 includes the current sense resistor RCS coupled to the first node 104 and the startup circuit output node 108. The current limiting circuit 112 also includes a second transistor Q2 with a gate coupled to the first node 104, a drain coupled to the second node 106 and a source coupled to the startup circuit output node 108. In the illustrated example that includes the third transistor Q3 of the precharge circuit 122, the current limiting circuit 112 includes a fourth transistor Q4 with a gate coupled to a first node 104, a drain coupled to a third node 124 and a source coupled to the startup circuit output node 108. When the enhancement mode transistor Q1 is turned on, the current sense resistor RCS provides a current sense voltage signal VCS that is proportional to the drain current IQ1 of the enhancement mode transistor Q1. If IQ1 exceeds a desired current limit (e.g., the threshold voltage of Q2 divided by RCS (VthQ2/RCS)), current sense voltage signal VCS turns on the transistors Q2 to discharge the gate G1 of transistor Q1, thereby reducing the current IQ1 of transistor Q1. The current sense voltage signal VCS also turns on Q4 to stop any further charging of the gate G1 of transistor Q1.

In one example, the startup circuit 100 includes a blocking circuit 126 that blocks current flow from the startup circuit output node 108 to the second node 106 and/or blocks current flow from the output node 108 to the third node 124 when the potential at the second node 106 and/or a third node 124 is lower than the potential at the startup circuit output node 108. In one example the blocking circuit includes a first blocking transistor Q7 with a source coupled to the startup circuit output node 108, a gate coupled to the second node 106 and a drain coupled to the source of the second transistor Q2). In the illustrated example of FIG. 1 that includes the precharge transistor Q3, the blocking circuit also includes a second blocking transistor Q8 with a source coupled to the startup circuit output node 108, a gate coupled to the third node 124 and a drain coupled to the source of Q4. When the potential at the startup circuit output node 108 is greater than at the second node 106, the gate-source voltage of the seventh transistor Q7 is negative.

Q7 is thereby turned off and prevents any current flowing from the startup circuit output node 108 to the second node 106. When the potential at the startup circuit output node 108 is greater than at a third node 124, the gate-source voltage of transistor Q8 is negative. Q8 is thereby turned off and prevents any current flowing from the startup circuit output node 108 to a third node 124. In one example, the enhancement mode transistor Q1, the second transistor Q2, the third transistor Q3, the fourth transistor Q4, the fifth transistor Q5, the sixth transistor Q6, the first blocking transistor Q7, and the second blocking transistor Q8 are enhancement mode gallium nitride (GaN) transistors. In one implementation, the transistors Q1, Q2, Q3, Q4, Q5, Q6, Q7 and Q8 are enhancement mode GaN transistors formed in a GaN die, as discussed further below in connection with FIG. 8.

During startup, the voltage regulation circuit 114 regulates the startup circuit output voltage VAUX across the capacitor CAUX. The voltage regulation circuit 114 includes a comparator 118 with a non-inverting input coupled to the startup circuit output node 108, and an inverting input coupled to a reference voltage signal VREF provided by a voltage source 120 referred to the reference node 110. The comparator 118 also has an output coupled to a voltage regulation output node 116 that provides an output signal VSD. In operation, the VSD signal controls the gate voltages of the transistors Q1 and Q3 to regulate the startup circuit output voltage VAUX during startup, and turns the transistors Q1 and Q3 off to shut down the startup circuit 100. The voltage regulation circuit 114 also includes a fifth transistor Q5 with a gate coupled to the voltage regulation output node 116, a drain coupled to the second node 106 and a source coupled to the reference node 110, and a sixth transistor Q6 with a gate coupled to the voltage regulation output node 116, a drain coupled to a third node 124 and a source coupled to the reference node 110.

The voltage regulation circuit 114 also includes a fifth transistor Q5 with a drain connected to the second node 106, a source connected to the reference node 110, and a gate connected to the voltage regulation output node 116. When the shutdown voltage signal VSD rises to or above the threshold voltage of the fifth transistor Q5, the fifth transistor Q5 turns on to connect the second node 106 to the reference node 110. This reduces the gate-source voltage VGS of the enhancement mode transistor Q1 and turns the enhancement mode transistor Q1 off. The example voltage regulation circuit 114 also includes a sixth transistor Q6 with a drain connected to the third node 124, a source connected to the reference node 110, and a gate connected to the voltage regulation output node 116. The sixth transistor Q6 also turns on in response to the shutdown voltage signal VSD rising above its threshold voltage to turn the third transistor Q3 off. In other implementations in which the precharge circuit 122 is omitted (e.g., FIG. 4 below), the sixth transistor Q6 can also be omitted from the voltage regulation circuit 114.

In operation when the startup circuit output voltage VAUX at the startup circuit output node 108 exceeds a desired value set by the reference voltage signal VREF 120, the comparator 118 pulls the shutdown signal voltage VSD high at the voltage regulation output node 116 to turn on the fifth transistor Q5 to discharge the gate G1 of the enhancement mode transistor Q1 to stop charging of the capacitor CAUX. The high shutdown voltage signal VSD at the node 116 also turns on the sixth transistor Q6 to discharge the third node 124 and stop any further charging of the gate G1 of the enhancement mode transistor Q1.

The current limiting circuit 122 operates concurrently with the voltage regulation circuit 114 to control the voltages at the second node 106 and the third node 124. If the current IQ1 of the enhancement mode transistor Q1 exceeds an upper limit set by the resistance of the sense resistor RCS and the threshold voltage of the transistor Q2, the current limiting circuit 122 reduces the voltage at the second node 106 by discharging the capacitor C1 to reduce the gate-source voltage VGS of the enhancement mode transistor Q1 to reduce the current IQ1 until IQ1 is within a defined limit (e.g., VthQ2/RCS). In this manner, the capacitor CAUX is charged during startup with a controlled current IQ1 of the transistor Q1. When the startup circuit output voltage VAUX at the startup circuit output node 108 exceeds a desired value set by a reference voltage signal VREF of a reference 120, the voltage regulation circuit 114 discharges the second node 106 to turn off the enhancement mode transistor Q1 to turn off the current IQ1 of transistor Q1 and thereby stop charging of a capacitor CAUX coupled to the startup circuit output node 108. A voltage regulation circuit 114 also discharges a third node 124 to turn off a precharge circuit and keep it turned off to prevent any further charging of the second node 106.

FIG. 2 shows a simplified electrical model 201 of the enhancement mode transistor Q1/Q3 in the startup circuit of FIG. 1, including a drain D1 coupled to a startup circuit input 202, a gate G1 connected to a second node 206, and a source S1 connected to a supply node 204, where the nodes 202, 204, and 206 respectively correspond to the respective nodes 102, 104 and 106 of FIG. 1. This example includes a resistor R2 connected between the drain and gate of the transistor Q1, and a resistor R4 connected between the gate and source of the transistor Q1 to represent impedance paths for leakage currents. The enhancement mode transistor Q1 in one example is a high-voltage GaN transistor that emulates operation of a JFET or depletion mode device to initially turn the transistor Q1 on in response to application of a rising input voltage signal VSW at the drain D1 of the enhancement mode transistor. In certain implementations, the enhancement mode transistor Q1 is a high-voltage GaN device, with a poor Miller ratio, in which the gate-to-source capacitance CGS is greater than the drain-to-gate capacitance CDG. The use of the enhancement mode transistor Q1 in the startup circuit 100 exploits the poor Miller ratio to facilitate startup without auxiliary supply power. A poor Miller ratio means that the drain-to-gate charge (defined by the drain-to-gate capacitance multiplied by the drain-to-source voltage) is greater than the gate-to-source charge (defined by the gate-to-source capacitance multiplied by the gate-to-source threshold voltage required to turn the device on).

As shown in FIG. 2, the enhancement mode transistor Q1 has a non-zero leakage current IDG from the drain D1 to the gate G1. In addition, the enhancement mode transistor Q1 has a non-zero leakage current IGS from the gate G1 to the source S1, as well as a non-zero leakage current IGG from the gate G1 to the ground reference. The example high voltage GaN enhancement mode transistor Q1 emulates JFET operation during startup by exploiting the poor Miller ratio of the transistor Q1. A poor Miller ratio means that the drain-to-gate charge (the drain-to-gate capacitance CDG multiplied by the drain-to-source voltage) is greater than the gate-to-source charge (the gate-to-source capacitance CGS multiplied by the gate-to-source threshold voltage required to turn the device on). In one example, the drain-source current IQ1 of the enhancement mode transistor Q1 is $C_{DG}*(dV_{DG}/dt)+I_{DG}$ which is larger than the total gate-source current and the gate-ground current ($C_{GS}*(dV_{GS}/dt)+I_{GS}+C_{GG}*(dV_{GG}/dt)+I_{GG}$).

The enhancement mode transistor Q1 has the drain-to-gate capacitance CDG, the gate-to-ground capacitance CGG, and the gate-to-source capacitance CGS, which are connected as schematically shown in dashed lines in FIG. 2. In one example, the capacitances CDG, CGG and CGS represent parasitic capacitances of the enhancement mode transistor Q1. The gate-to-source capacitance CGS of the enhancement mode transistor Q1 is greater than the drain-to-gate capacitance CDG, and the ratio of the gate-to-source capacitance CGS to the drain-to-gate capacitance CDG is less than 1000. In one example, the ratio of the gate-to-source capacitance CGS to the drain-to-gate capacitance CDG is greater than 5. In another example, the ratio of the gate-to-source capacitance CGS to the drain-to-gate capacitance CDG is greater than 10. In another example, the ratio of the gate-to-source capacitance CGS to the drain-to-gate capacitance CDG is greater than 20. In another example, the ratio of the gate-to-source capacitance CGS to the drain-to-gate capacitance CDG is greater than 100. In another example, the ratio of the gate-to-source capacitance CGS to the drain-to-gate capacitance CDG is greater than 200. In another example, the ratio of the gate-to-source capacitance CGS to the drain-to-gate capacitance CDG is greater than 300.

On system startup, the poor Miller ratio caused by the ratio CGS/CDG, alone or in further combination with the precharge circuit 122, allows the rising input voltage signal VSW to deliver a startup voltage VGS at the gate G1. The example of FIG. 1 shows a first resistor R1 in dashed line that represents the parasitic leakage path from gate to source of the enhancement mode transistor Q1 to emulate the gate leakage. This initial gate voltage VGS rises above a threshold voltage Vt of the enhancement mode transistor Q1. The CDG/CGS ratio does not depend on the width of a given implementation of the enhancement mode transistor Q1. The startup behavior facilitates turn on in response to a rising input voltage signal VSW at the drain D1 of the enhancement mode transistor Q1. In one example the enhancement mode transistor Q1 is a GaN transistor with a width dimension of 100,000 um, an off-state gate-to-source capacitance CGS=80 pF, and an on-state gate-to-source capacitance CGS=280 pF. In this example, the drain-to-gate capacitance CDG varies as a function of the drain-to-gate voltage VDG. The ratio of the gate-to-source capacitance CGS to the drain-to-gate capacitance CDG is less than 1000, for example, CDG=8.7 pF for VDG<50 V, CDG=0.45 pF for 50 V<VDG<110 V, and CDG=0.23 pF for 110 V<VDG when VGS is below Vt. During initial startup when VGS is below Vt, the capacitance ratio CDG/CGS allows the enhancement mode transistor Q1 to turn on in response to the voltage rise (e.g., dV/dt) of the input voltage signal VSW.

The example startup circuit 100 in FIG. 1 also includes a blocking circuit 126. In operation, the blocking circuit 126 prevents reverse current flow from the startup circuit output node 108 to the second node 106 or the third node 124 when the potential at the second node 106 and/or a third node 124 is lower than the potential at the startup circuit output node 108. The example blocking circuit 126 in FIG. 1 includes circuit components (e.g., transistors Q7 and Q8) connected between the respective sources of the transistors Q2 and Q4, and the startup circuit output node 108. In another possible implementation, the circuit components of the blocking circuit 126 can be diodes, for example, with anodes connected to the respective sources of the transistors Q2 and Q4, and cathodes connected to the startup circuit output node 108. In yet another implementation, the circuit components of the blocking circuit 126 can be resistors, respectively connected between the sources of the transistors Q2 and Q4, and the startup circuit output node 108. In another possible implementation, the blocking circuit 126 can instead include circuit components connected to the drains of the respective transistors Q2 and Q4, for example, with a first circuit component connected between the drain of the transistor Q2 and the second node 106, and a second blocking circuit component connected between the drain of the transistor Q4 and the third node 124. In these implementations, the blocking circuit components can be resistors, transistors or diodes.

The voltage regulation circuit 114 in one example turns the enhancement mode transistor Q1 off in response to the startup circuit output voltage VAUX of the startup circuit output node 108 exceeding a non-zero threshold set by the reference voltage signal VREF. In another possible implementation, the voltage regulation circuit 114 provides a feedback loop that controls (e.g., regulates) the startup circuit output voltage VAUX. In one implementation, the voltage regulation circuit 114 provides on/off control to regulate the amplitude of the startup circuit output voltage VAUX using the comparator 118. In this example, the regulation circuit 114 compares the startup circuit output voltage VAUX to the reference voltage signal VREF and the comparator 118 generates the shutdown output signal VSD, which controls the charging current IQ1 to charge the capacitor CAUX. In one example, the voltage regulation circuit 114 generates the shutdown signal VSD in a first state to allow operation of the transistors Q1 and Q3 to charge the capacitor CAUX when the startup circuit output voltage VAUX is less than a non-zero threshold set by the voltage reference 120. In response to the startup circuit output voltage VAUX equaling or exceeding the non-zero threshold set by the voltage reference 120, the comparator 118 generates the shutdown signal VSD in a second state that turns Q1 and Q3 off by turning Q5 and Q6 on.

In one example, a voltage feedback loop is implemented in a silicon CMOS process, including the voltage 120, a feedback divider (not shown) that provides an input voltage signal to the non-inverting (e.g., +) input of the comparator 118 as a voltage signal that is a fraction of the startup circuit output voltage VAUX. In another example, the voltage feedback loop is implemented discreetly, including discrete circuit components for a reference voltage circuit, a feedback divider and a comparator. In another example, the voltage feedback loop is implemented monolithically, for example, in an enhancement mode GaN process (e.g., including a voltage reference 120, Q15, Q16, R5, and elements 406, 408, 410 in FIG. 4 below).

In another implementation, the comparator 118 is replaced by an amplifier (e.g., and op amp) with a noninverting (+) input connected to the startup circuit output node 108 (e.g., or to a voltage divider coupled to the output node 108), and an inverting (−) input connected to the positive terminal of the voltage reference 120. The amplifier in this case compares the startup circuit output voltage VAUX to the non-zero threshold reference voltage signal VREF. The output of the amplifier in this example is connected to the voltage regulation output node 116, and provides the shutdown voltage signal VSD to the voltage regulation output node 116 based on the difference between the startup circuit output voltage VAUX and the non-zero reference voltage signal VREF. In this example, the voltage regulation circuit 114 provides linear regulation of the startup circuit output voltage VAUX during startup operation, for example, until an external regulator (not shown in FIG. 1) begins to regulate a supply voltage (e.g., VDD) at a supply node coupled by a diode to the startup circuit output node 108 (e.g., FIG. 11 below).

The startup circuit 100 provides safe startup for a high amplitude input voltage signal VSW through use of the enhancement mode transistor Q1 in combination with emulation of JFET or depletion mode transistor operation. During semiconductor fabrication processing, the use of the use of the enhancement mode transistor Q1 avoids additional masks in the process that would otherwise be needed to form an integrated depletion mode startup transistor or avoids an additional external JFET for high-voltage start-up. The enhancement mode transistor Q1 can turn on without the need of an auxiliary supply voltage in response to a rising input voltage signal VSW at the drain D1, due to a poor Miller ration. A poor Miller ratio means that the drain-to-gate charge (defined by the drain-to-gate capacitance multiplied by the drain-to-source voltage) is greater than the gate-to-source charge (defined by the gate-to-source capacitance multiplied by the gate-to-source threshold voltage required to turn the device on).

The closed loop operation of the current limiting circuit 112 facilitates safe operation to mitigate or prevent uncontrolled high inrush current during start-up, even if the drain D1 rises to a high voltage. The example startup circuit 100 provides safe start-up operation for a wide range of rising input voltages VSW during all phases of circuit startup, including sharp edges when a host device is plugged in, operation when the input voltage signal VSW is at a peak value, and also for slowly rising (e.g., low slope) input voltage signals VSW, such as when a host device is plugged in when an AC line supply voltage is 0 V and only the slope of a low frequency (e.g., 50 or 60 Hz) input voltage signal VSW is available for starting the host device. In these situations, the enhancement mode transistor Q1 conducts drain-source current IQ1 to start the circuit 100 at an initial gate-source voltage VGS of 0 V (JFET or depletion mode emulation). The startup circuit 100 also turns the enhancement mode transistor Q1 off after the startup circuit output voltage VAUX reaches a predetermined threshold using the voltage regulation circuit 114.

Figure 3:
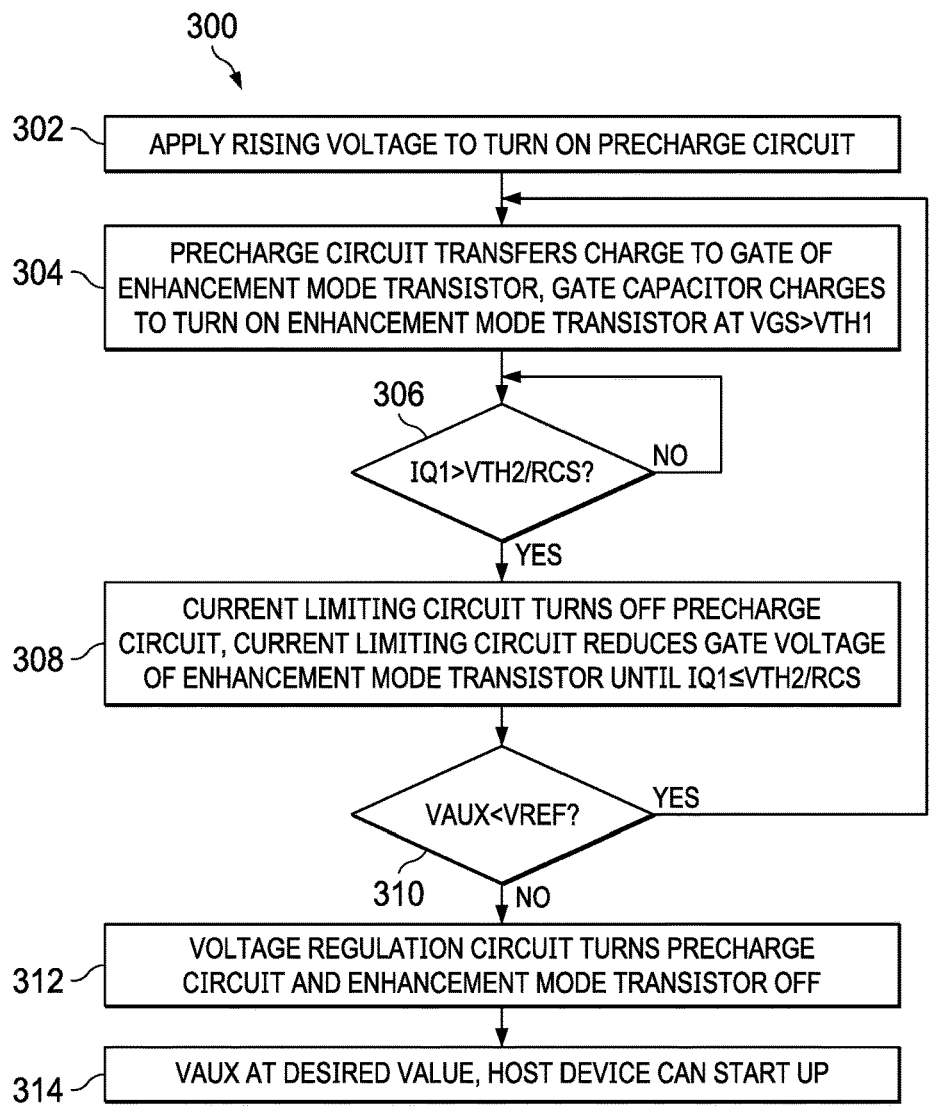
FIG. 3 is a flow diagram of a method to start up a circuit according to another embodiment.

FIG. 3 shows a method 300 to start up a circuit. The method 300 can be implemented using the startup circuit 100 of FIG. 1 in one example, in which the startup circuit 100 initially starts in response to a rising input voltage signal VSW, charges the capacitor CAUX in a charging mode, and then shuts down using the voltage regulation circuit 114. Thereafter, a host circuit (not shown in FIG. 1) can provide separate regulation of the startup circuit output voltage VAUX. At 302 in FIG. 3, the method 300 includes applying a rising voltage signal (e.g., VSW in FIG. 1) to the drain D1 of the enhancement mode transistor Q1 to turn the enhancement mode transistor Q1 on. In one example, the rising voltage of the drain of the enhancement mode transistor Q1 turns directly the enhancement mode transistor Q1 on. In another implementation, the rising voltage VSW turns on the precharge transistor Q3 of the precharge circuit, and the precharge circuit 122 provides a rising gate-source voltage VGS to the second node 106. At 304 and FIG. 3, the precharge circuit 122 transfers charge to the gate of the enhancement mode transistor Q1 and the gate capacitor Cl, and the enhancement mode transistor Q1 turns on in response to the gate voltage VGS exceeding its threshold voltage (e.g., VGS>VTH1). The enhanced mode transistor Q1 delivers the charging current IQ1 to the startup circuit output node 108 (e.g., through the first resistor RCS) to charge the capacitor CAUX. The method 300 continues at 306 with the current limiting circuit 112 controlling the gate voltage VGS of the enhancement mode transistor Q1 while the transistor current IQ1 is less than or equal to VTH2/RCS, where VTH2 is the threshold voltage of the current limiting circuit transistor Q2 in FIG. 1, to limit the charging current IQ1. In response to the current IQ1 exceeding VTH2/RCS (YES at 306 and FIG. 3), the current limiting circuit 112 turns off the precharge circuit 122 at 308, and the current limiting circuit 112 reduces the gate voltage of the enhancement mode transistor Q1 until the transistor current IQ1 is less than or equal to VTH2/RCS. The voltage regulation circuit 114 continues operation at 304-308 while the startup circuit output voltage VAUX of the startup circuit output node 108 is less than the reference voltage signal VREF of the reference 120 and FIG. 1 (YES at 310 in FIG. 3). In one example, controlling the gate voltage VGS at 304 includes delivering the current sense voltage signal VCS to the gate of the second transistor Q2 to control a current of the second transistor Q2 according to the charging current IQ1, and controlling the gate voltage VGS of the enhancement mode transistor Q1.

At 310, the voltage regulation circuit 114 determines whether the startup circuit output voltage VAUX of the startup circuit output node 108 has reached or exceeds the reference voltage signal VREF. If not (YES at 310), the method 300 continues the closed loop current limiting and blocking at 304 through 308 as previously described. In response to the startup circuit output voltage VAUX of the startup circuit output node 108 reaching or exceeding the reference voltage signal VREF (NO at 310), the voltage regulation circuit 114 turns the precharge circuit 122 off and turns the enhancement mode transistor Q1 off at 312. At 314 and FIG. 3, with the startup circuit output voltage VAUX of the startup circuit output node 108 at the desired value, the host device can start up. The high-voltage start-up circuit may be combined with alternative methods to generate the auxiliary supply voltage once the system has powered up.

Figure 4:
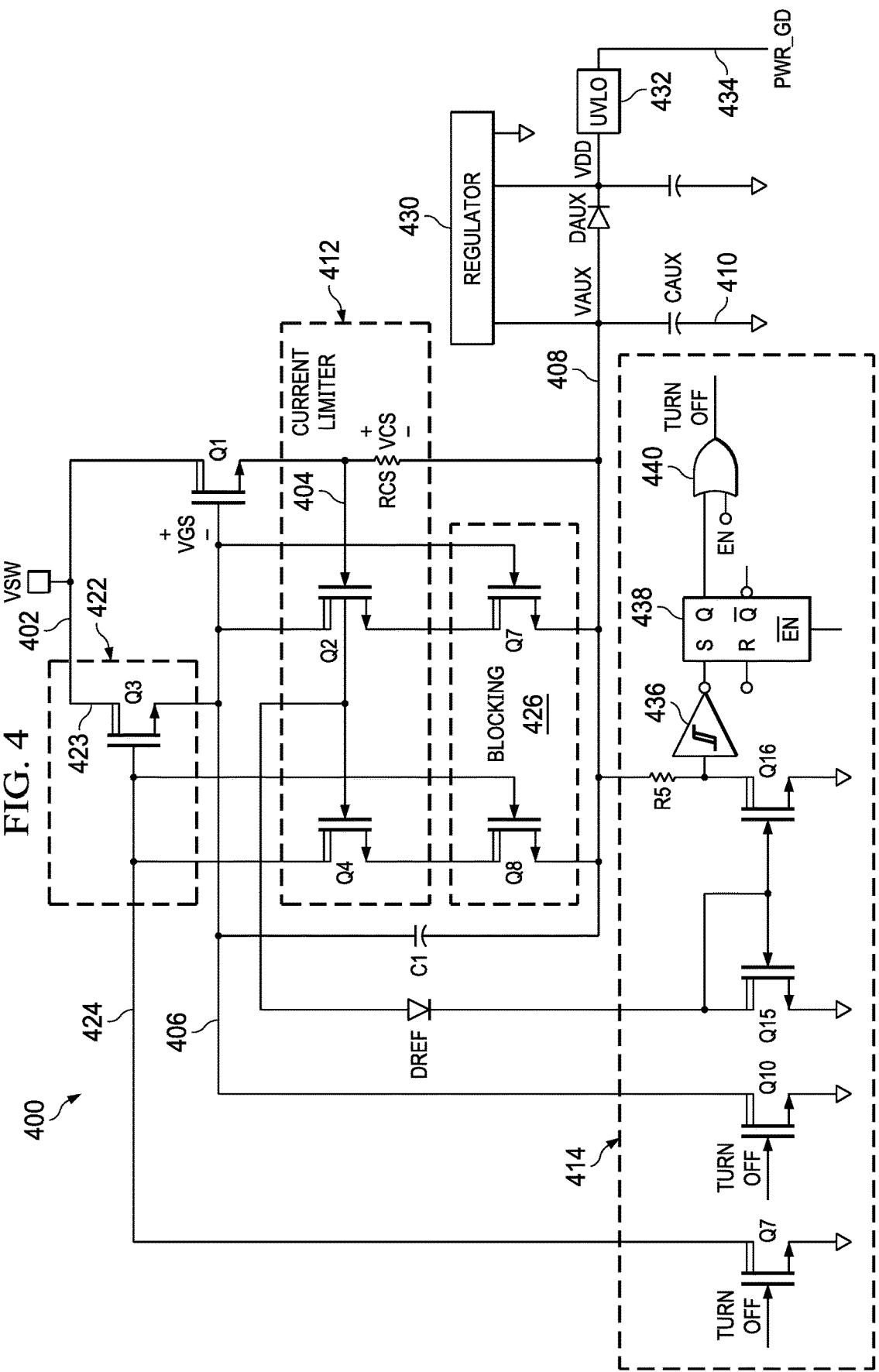
FIG. 4 is a schematic diagram of a system with a startup circuit according to another embodiment.

FIG. 4 shows a system with another example startup circuit 400, in which the voltage regulation is implemented monolithically, for example, in an enhancement mode GaN process. The example startup circuit 400 includes various circuits and components generally as described above in connection with the startup circuit 100 of FIG. 1. The startup circuit 400 includes nodes, components, and circuits 402, 404, 406, 408, 410, 412, 414, 422, 423, 424, and 426 that generally correspond to the respective nodes, components, and circuits 102, 104, 106, 108, 110, 112, 114, 122, 123, 124, and 126 of FIG. 1. The startup circuit 400 in FIG. 4 includes the enhancement mode transistor Q1, the current limiting circuit 412, the voltage regulation circuit 414, and the precharge circuit 422. The enhancement mode transistor Q1 includes the drain D1 coupled to a startup circuit input 402, the source S1 coupled to the first node 404, and the gate G1 coupled to the second node 406. The current limiting circuit 412 in FIG. 4 is coupled to the first node 404, the output node 408, and the second node 406 to limit the enhancement mode transistor current IQ1, and the voltage regulation circuit 414 is coupled to the output node 408 and the second node 406.

The example blocking circuit 426 in FIG. 4 includes the transistor Q7 connected in series with the second transistor Q2 to mitigate current flow from the output node 408 to the second node 406. The example blocking circuit 426 in FIG. 4 also includes the transistor Q8 connected in series with the fourth transistor Q4 to mitigate current flow from the output node 408 to the third node 424. In this example, the transistor Q7 has a drain connected to the source of the second transistor Q2, a source connected to the output node 408, and a gate connected to the second node 406. The transistor Q8 in FIG. 4 has a drain connected to the source of the fourth transistor Q4, a source connected to the output node 408, and a gate connected to the third node 424. The voltage regulation circuit 414 in FIG. 4 includes a current mirror formed by transistors Q15 and Q16, with a fifth resistor R5 connected between the output node 408 and the drain of the transistor Q16. A diode DREF has an anode connected to the node 404 and a cathode connected to the drain of the transistor Q15, and the sources of the transistors Q15 and Q16 are connected to the reference node 410. A hysteresis inverter 436 receives a voltage signal from the drain of the transistor Q16 and provides an inverted output voltage signal to a set (S) input of an R-S flip flop 438. The reset (R) input of the flip flop 438 is controlled by an enable voltage signal EN (e.g., from a host circuit). An OR gate 440 is controlled by the data (Q) output of the flip flop 438 and by the enable signal EN. An output of the OR gate 440 provides the turn off signal TURN OFF to the gates of the transistors Q5 and Q6.

The system in FIG. 4 includes a regulator circuit 430 connected to the supply node 408 to receive and ultimately regulate the supply voltage signal VAUX across the capacitor CAUX. The input node 402 receives the input voltage signal VSW as previously described, and the regulator 430 operates once initial power is established to regulate an output voltage signal VDD according to the voltage VAUX of the supply node 408. The system also includes a diode DAUX with an anode connected to the supply node 408 and a cathode connected to a second power supply node. A supply capacitor CVDD is connected between the second supply node and the reference node 410. Current from the supply node 408 to the second supply node charges the supply capacitor CVDD to develop a second supply voltage signal VDD at the second supply node. The system also includes an undervoltage lockout circuit 432 (UVLO) that monitors the second supply voltage signal VDD. In one example, in response to the second supply voltage signal VDD reaching a predetermined threshold level, the lockout circuit 432 provides a status signal PWR_GD (e.g., "power good") at an output 434. The status signal PWR_GD in one example has a first state (e.g., a voltage at or near the voltage of the reference node 410) in response to the second supply voltage signal VDD being below the predetermined threshold level, and a different second state (e.g., active high) in response to the second supply voltage signal VDD exceeding the predetermined threshold level.

Figure 5:
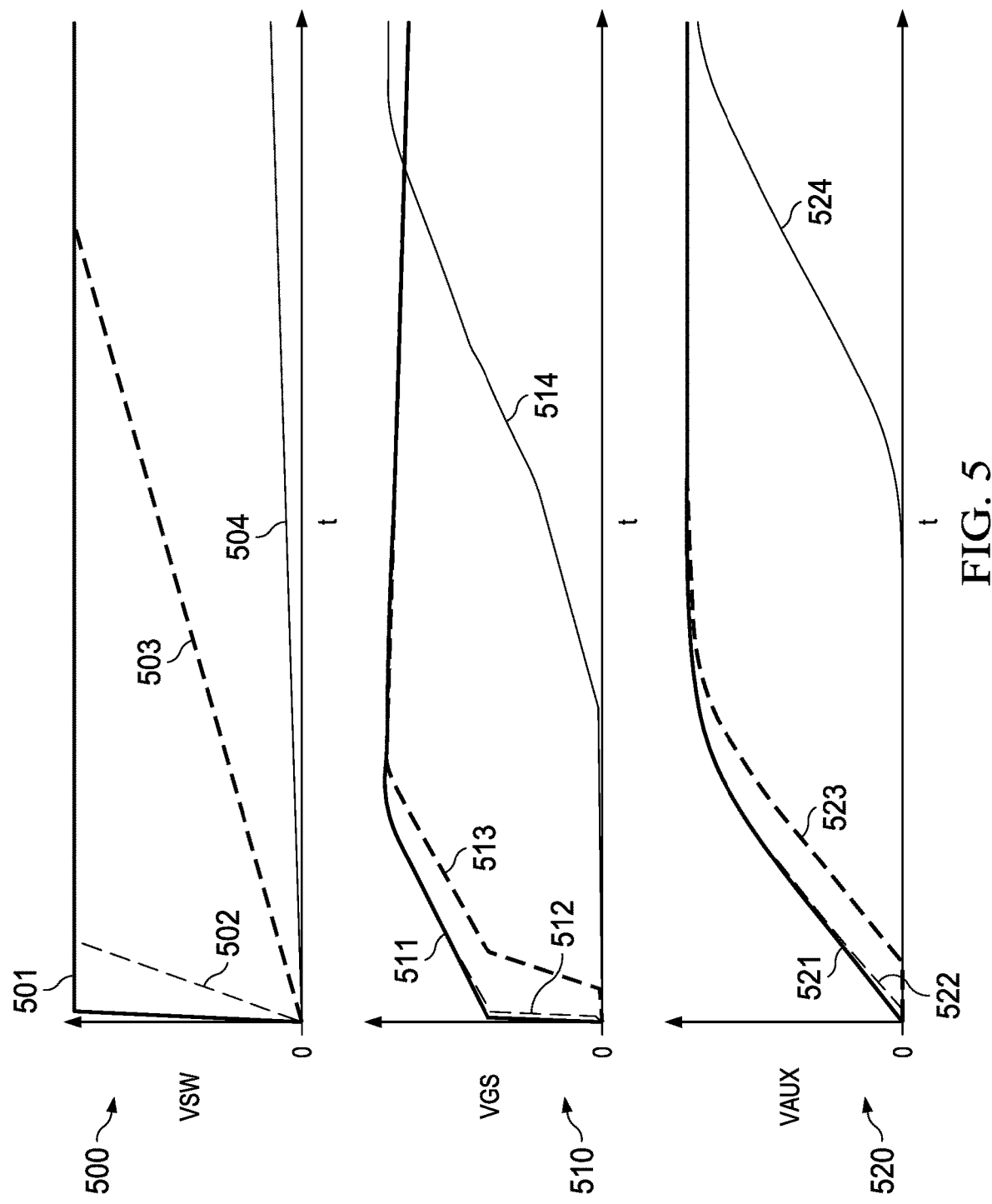
FIG. 5 is a signal diagram of example voltages in the startup circuit of FIG. 1 for several example input voltage signals with different rise times.
Figure 6:
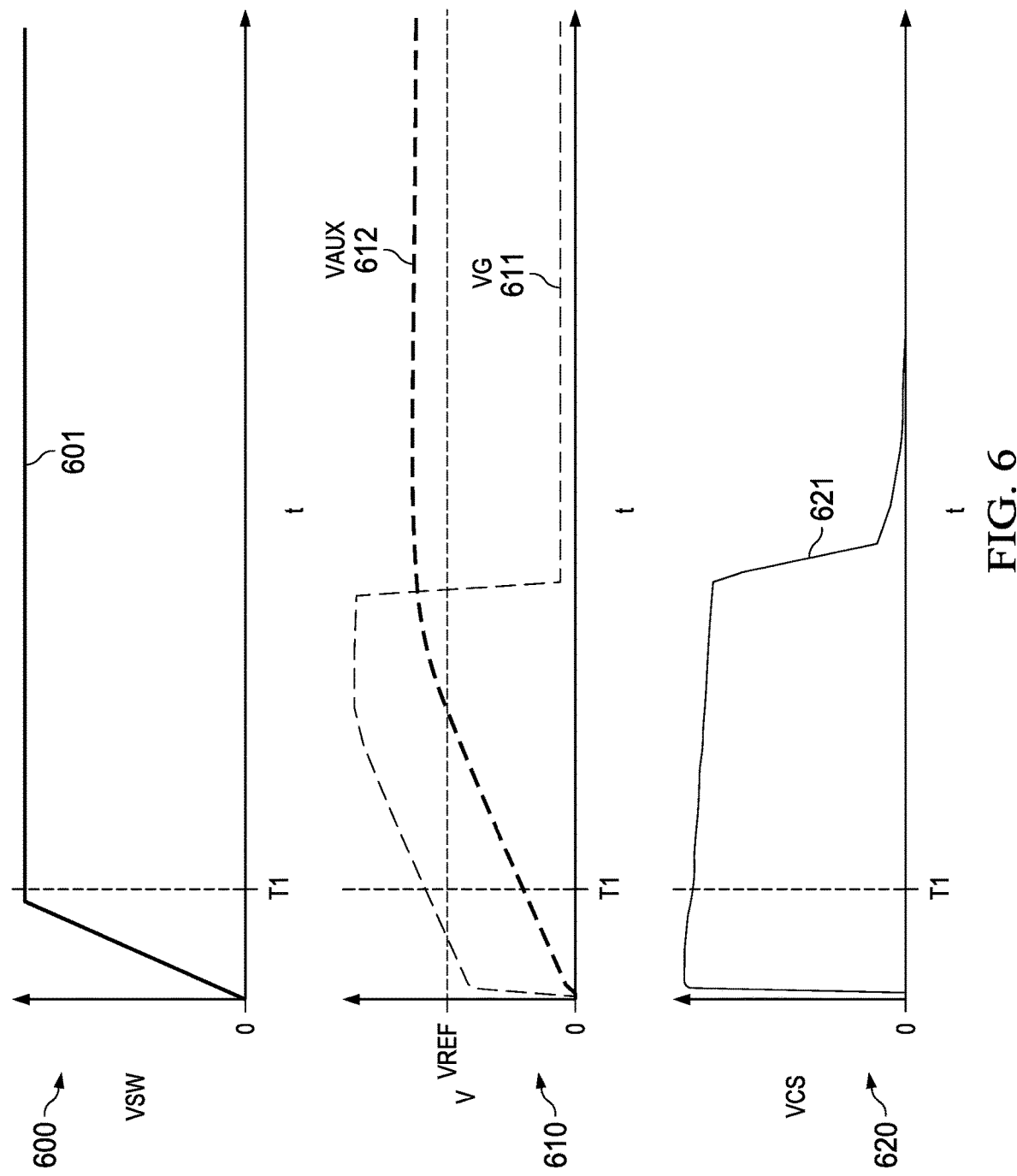
FIG. 6 is a signal diagram of example waveforms in the startup circuit of FIG. 1 during startup and subsequent current limiting operation.

Referring also to FIGS. 5 and 6, one implementation of the startup circuit 400 of FIG. 4 charges the capacitor CAUX up to a target voltage level for input voltage rise times from 1 μs up to 10 ms. This accommodates startup using input voltage signals VSW of FIG. 4 with rise times slower than that of a power grid frequency. FIG. 5 shows simulated waveforms including a graph 500 with VSW curves 501, 502, 503 and 504 for input voltage signal rise times respectively increasing from 1 μs (curve 501) up to 10 ms (curve 504). A graph 510 in FIG. 5 includes gate-source voltage curves 511, 512, 513 and 514 showing the enhancement mode transistor gate-source voltage VGS at the rise times from 1 μs up to 10 ms corresponding to the respective VSW curves 501, 502, 503 and 504. A graph 520 in FIG. 5 shows output node voltage curves 521, 522, 523 and 524 at the rise times from 1 μs up to 10 ms corresponding to the respective VSW curves 501, 502, 503 and 504 in the graph 500.

FIG. 6 shows graphs 600, 610, and 620 that illustrate operation of the current limiting circuit 112 for an input voltage signal VSW with a 1 ms rise time (curve 601 in graph 600). A curve 611 in the graph 610 shows the gate voltage VG of the enhancement mode transistor at node 406 that initially rises quickly due to the precharge circuit via Q3 (422). The current limiting circuit 112 keeps the gate-source voltage VGS of the enhancement mode transistor Q1 constant. As a result, the capacitor CAUX (410) is charged with a constant current. A curve 612 shows the startup circuit output voltage VAUX showing the current limited charging of the capacitor CAUX from the drain-source current IQ1 of the enhancement mode transistor Q1. The graph 620 includes a curve 621 that shows the current sense voltage signal VCS across the resistor RCS, which rises quickly and then gradually decreases during the current limited charging operation of the startup circuit 400. When the startup circuit output voltage VAUX reaches its target level at time T1, the startup charging is terminated by the voltage regulation circuit 414 pulling the second and third nodes 406 and 424 low. In operation, once the voltage regulation circuit 414 detects a threshold level of the startup circuit output voltage VAUX, the external regulator circuit 430 begins regulating the startup circuit output voltage VAUX and the voltage regulation circuit 414 turns the enhancement mode transistor Q1, causing the current sense voltage signal curve 621 (VCS) to decrease.

Figure 7:
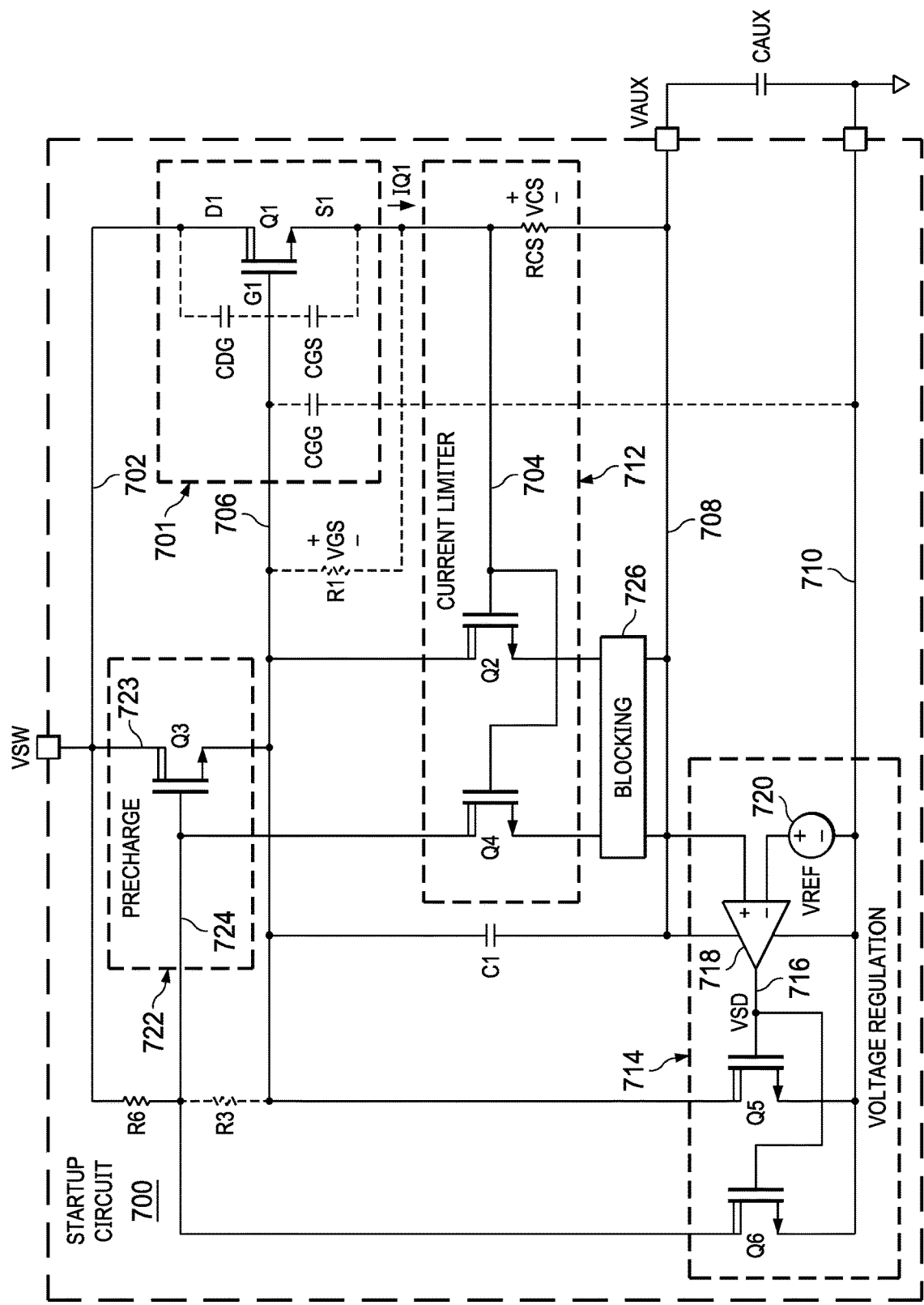
FIG. 7 is a schematic diagram of another example startup circuit with a two-dimensional electron gas resistor according to another embodiment.

FIG. 7 is a schematic diagram of another example startup circuit 700 that includes nodes, components, and circuits 701, 702, 704, 706, 708, 710, 712, 714, 716, 718, 720, 722, 723, 724, and 726 that generally correspond to the respective nodes, components, and circuits 101, 102, 104, 106, 108, 110, 112, 114, 116, 118, 120, 122, 123, 124, and 126 of FIG. 1. The startup circuit 700 includes the enhancement mode transistor Q1, the current limiting circuit 712, the voltage regulation circuit 714, the precharge circuit 722, and the blocking circuit 726 as described above in connection with the example of FIG. 1. The startup circuit 700 additionally includes a resistor R6 (which can be implemented as two-dimensional electron gas (2DEG) resistor), with a first terminal coupled to the drain D1 of the enhancement mode transistor Q1 at the startup circuit input 702, and a second terminal connected to the third node 724. The inclusion of the resistor R6 improves robustness by providing a static current for start-up, particularly for start-up even at slow slew-rates and/or high leakage currents for a GaN enhancement mode transistor Q1. In one example, the 2DEG resistor R6 is sized to conduct approximately 50 μA in saturation (e.g., 10 MΩ). In another implementation, the resistor R6 is replaced with a current source connected between the drain D1 of the enhancement mode transistor Q1 and the third node 724 to provide a controlled current to the third node 724 and to the gate of the third transistor Q3.

Figure 8:
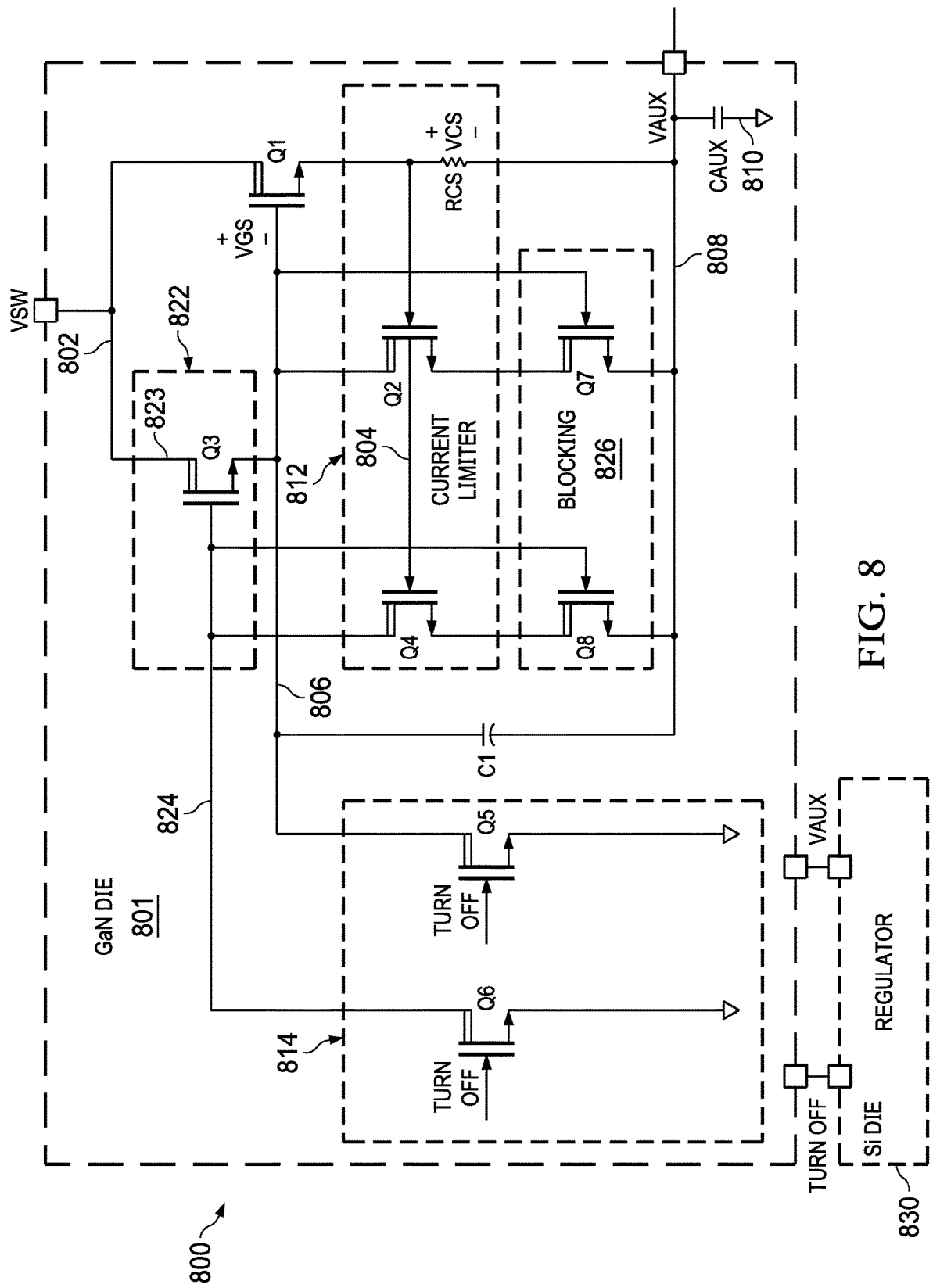
FIG. 8 is a schematic diagram of a system with a startup circuit according to another embodiment.

FIG. 8 shows an example system implemented as a multi-chip module (MCM), including a startup circuit 800 that includes nodes, components, and circuits 802, 804, 806, 808, 810, 812, 814, 822, 823, 824, and 826 that generally correspond to the respective nodes, components, and circuits 102, 104, 106, 108, 110, 112, 114, 122, 123, 124, and 126 of FIG. 1, as well as nodes, components, and circuits 830, 832, and 834 that generally correspond to the respective nodes, components, and circuits 430, 432, and 434 of FIG. 4. The startup circuit 800 includes the enhancement mode transistor Q1, the current limiting circuit 812, the voltage regulation circuit 814, the precharge circuit 822, and the blocking circuit 826. In one implementation, the enhancement mode transistor Q1, the second transistor Q2, the third transistor Q3, the fourth transistor Q4, the fifth transistor Q5, the sixth transistor Q6, the first blocking transistor Q7, and the second blocking transistor Q8 are gallium nitride GaN transistors in a first GaN die 801. In this example, the voltage source (e.g., 720 of FIG. 7) and the comparator 718 are in a second Silicon die 830. In one example, the startup circuit 800 is implemented as a dedicated startup integrated circuit. The example implementation of FIG. 8 does not include the resistor R6 described above in connection with FIG. 7, but such a resistor can be included in a different implementation. In this example, the startup circuit 800 is implemented as a first chip, and a portion of the voltage regulation circuit (e.g., circuit 714 in FIG. 7) is implemented in Silicon as a regulator chip 830 with an output pin or pad that provides the turn off signal TURN OFF to a corresponding input pin or pad of the startup circuit 800. In this implementation, moreover, the regulator circuit Silicon die 830 includes an input pin or pad that is connected to the output node to receive the startup circuit output voltage VAUX, for example, from a corresponding output pin or pad of the startup circuit 800 as shown, which can be either on PCB level, or on package level in a multi-chip module. In the example of FIG. 8, the voltage regulation is performed by the regulator circuit chip 830, for example, using an internal feedback divider for the startup circuit output voltage VAUX and a bandgap reference, to generate the turn off signal TURN OFF with a comparator.

Figure 9:
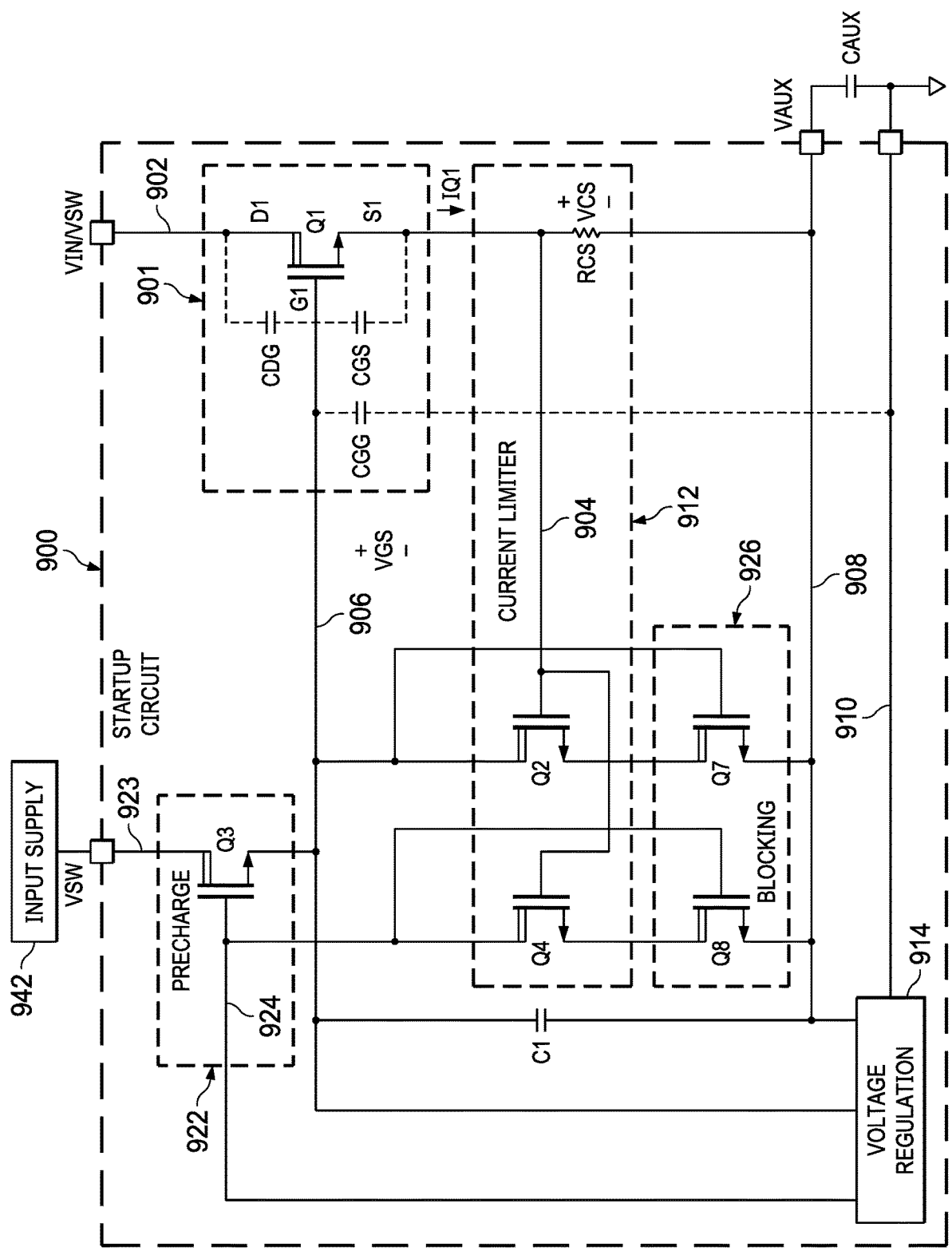
FIG. 9 is a schematic diagram of a system with a startup circuit with a separate precharge circuit input to receive a voltage signal from an input supply circuit according to another embodiment.
Figure 10:
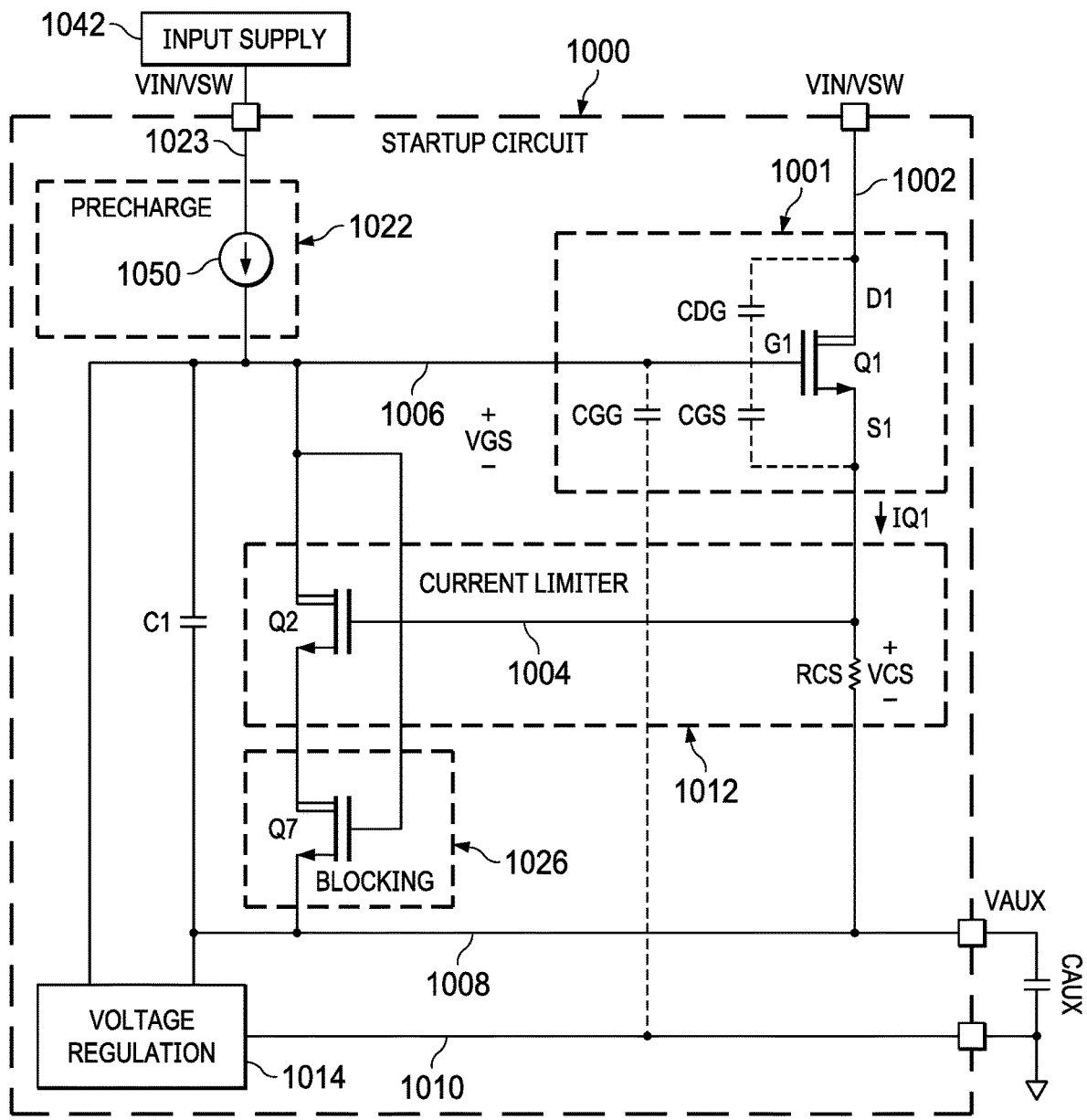
FIG. 10 is a schematic diagram of a system with a startup circuit with a precharge circuit including a current source connected to an input supply circuit according to another embodiment.

Referring also to FIGS. 9 and 10, the start-up system in some examples has two high-voltage nodes. A first high voltage node provides an input to the precharge circuit 122 (FIG. 1) and a second high voltage node provides an input to the enhancement mode transistor Q1. In various implementations, the high-voltage nodes can be either connected to a static high-voltage supply voltage (e.g., VIN), or to a switch node (e.g., VSW). In the example startup circuits with the precharge circuit (e.g., circuit 122 above), there are four possible configurations. FIG. 9 shows an example system, including a startup circuit 900 that includes nodes, components, and circuits 901, 902, 904, 906, 908, 910, 912, 914, 922, 923, 924, and 926 that generally correspond to the respective nodes, components, and circuits 101, 102, 104, 106, 108, 110, 112, 114, 122, 123, 124, and 126 of FIG. 1. In this example, an input supply circuit 942 is connected to a separate input node 923 of the precharge circuit 922. The drain of the precharge circuit transistor Q3 is connected to a switch node voltage signal VSW. The drain D1 of the enhancement mode transistor Q1 is coupled to a startup circuit input 902. The startup circuit input 902 is coupled in one example to a static input voltage signal VIN (e.g., a DC input voltage). In another implementation, the startup circuit input 902 and the drain D1 of the enhancement mode transistor Q1 is coupled to the switch node voltage signal VSW.

FIG. 10 shows another example system, including a startup circuit 1000 that includes nodes, components, and circuits 1001, 1002, 1004, 1006, 1008, 1010, 1012, 1014, 1022, 1023, and 1026 that generally correspond to the respective nodes, components, and circuits 101, 102, 104, 106, 108, 110, 112, 114, 122, 123, and 126 of FIG. 1, as well as nodes, components, and circuits, and 1042 and 1023 that generally correspond to the respective nodes, components, and circuits 942, and 923 of FIG. 9. In this example, the precharge circuit 1022 includes a current source 1050 connected between the input supply circuit 1042 at the precharge circuit input node 1023, and the second node 1006. In operation in response to application of the voltage signal VIN, the current source 1050 provides a gate current to the gate G1 of the enhancement mode transistor Q1 at the second node 1006 to turn the transistor Q1 on for startup. The static precharge circuit as shown in FIG. 10 does not need the dynamic triggering action of the switch node voltage VSW, but can be connected to a static supply node, and one implementation has both devices Q1 and the precharge current source connected to VIN. The precharge circuit can be implemented in two ways, as shown in FIGS. 9 and 10, respectively. In the example precharge circuit 122 of FIG. 1, the precharge transistor Q3 turns on dynamically in response to a positive voltage slew-rate (e.g., a rising switch node voltage VSW) at the drain. In the example of FIG. 9, the precharge transistor Q3 in the circuit 922 turns on in response to a positive slew rate caused by a rising input voltage signal VIN from the input supply circuit 942. In the example of FIG. 10, the precharge circuit 1022 includes a high voltage precharge current source 1050 that provides static start up to turn the enhancement mode transistor Q1 on.

Figure 11:
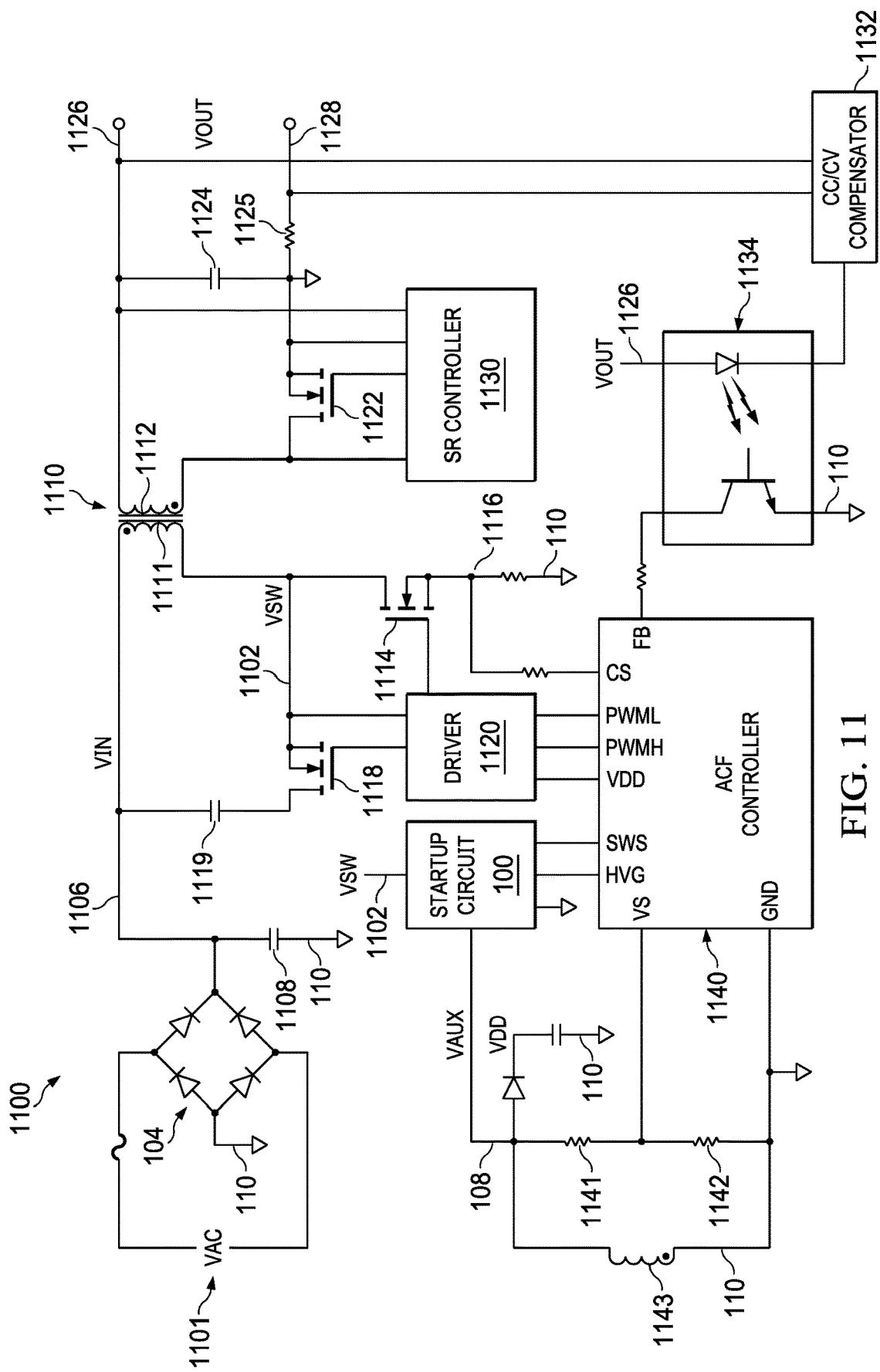
FIG. 11 is a schematic diagram of a power conversion system with a startup circuit according to another embodiment.

FIG. 11 shows a power conversion system 1100 with a flyback DC to DC switching converter and the above described startup circuit 100 according to another embodiment. The power conversion system 1100 includes an AC input 1101 configured to be coupled to an AC input source, in this case a single phase supply that provides an AC input voltage $V_{AC}$. The flyback converter includes a switch node 1102 that is coupled to the startup circuit input (e.g., 102 in FIG. 1 above). The power conversion system 1100 also includes a diode bridge rectifier 1104 with first and second nodes coupled to the AC input 1101. The diode bridge rectifier 1104 also includes a third node coupled to a ground reference node (e.g., the reference node 110 described above), and a supply input 1106 that provides a DC input voltage signal VIN across a capacitor 1108. The flyback switching converter receives the DC input voltage signal VIN and converts the input voltage to an isolated DC output voltage signal $V_{OUT}$ to drive a load (not shown). The example flyback converter includes a transformer 1110 having a primary winding 1111 and a secondary winding 1112. A first terminal or node of the primary winding 1111 is coupled to the input voltage signal VIN at the supply input 1106, and the second terminal or node of the primary winding 1111 is coupled to the switch node 1102. A first (e.g., low-side) converter switch 1114 (e.g., a high-voltage n-channel MOSFET or other high voltage transistor) includes a drain coupled to the switch node 1102, a source 1116 coupled through a resistor to the reference node 110, and a gate. The flyback converter further includes a second (e.g., high-side) converter switch 1118 includes a source coupled to the switch node 1102, a drain coupled through a capacitor 1119 to the supply input 1106, and a gate. The first and second converter switches 1114 and 1118 are controlled by pulse width modulated (PWM) switching control signals provided to their respective gates by a switch driver circuit 1120 to control current flow through the primary winding 1111 of the transformer 1110.

The flyback converter includes an isolated secondary side output circuit coupled to the transformer secondary winding 1112. A secondary side switch 1122 includes a drain coupled to the lower terminal of the secondary winding 1112, a source coupled through a resistor 1125 to a lower output terminal 1128, and a gate. A capacitor 1124 includes a first terminal coupled to the upper terminal of the secondary winding 1112 and an upper output terminal 1126. A second terminal of the capacitor 1124 is coupled to the source of the secondary side switch 1122 and an output, and reference. The gate of the secondary side switch 1122 is coupled to a switching rectifier controller 1130 to regulate the output voltage across the capacitor 1124. The example flyback converter also includes a constant current/constant voltage compensator circuit 1132 that senses the output voltage $V_{OUT}$ at the output terminals 1126 and 1128. The compensator circuit 1132 provides a signal to an optical coupler circuit 1134 to provide an output voltage feedback signal FB to a primary side controller 1140.

In one example, the primary side controller 1140 is an active clamp feedback (ACF) controller that receives the feedback signal FB and generates high and low pulse width modulation control signals PWMH and PWML to the driver 1122 regulate the output voltage $V_{OUT}$ at the output terminals 1126 and 1128. In this example, the controller 1140 includes a regulator (e.g., regulator 430 and UVLO 432 in FIG. 4 above) that regulates a supply voltage VDD provided to the driver circuit 1120. As further shown in FIGS. 11, the startup circuit 100 is coupled to the switch node 1102 (e.g., at the startup circuit input 102 in FIG. 1), and the startup circuit output node 108 develops the startup circuit output voltage VAUX. The startup circuit output node 1108 is coupled through an auctioneering diode to a supply voltage terminal or node that provides a supply voltage VDD to power the controller 1140 and the driver circuit 1120. The controller 1140 receives a voltage sense signal VS from a resistive divider circuit formed by a first resistor 1141 and a second resistor 1142 coupled in series with one another between the startup circuit output node 108 and the reference node 110. The power conversion system 1100 in this example also includes an auxiliary secondary winding 1143 of the transformer 1110 that provides power to the startup circuit output node 108 after the startup circuit 100 is turned off, in order to maintain the supply voltage VDD during steady-state operation when the controller 1140 toggles the primary side switches 1114 and 1118 during DC to DC converter operation. As discussed above, the enhancement mode transistor Q1 of the startup circuit 100 acts as a current source at startup to establish a supply voltage VAUX for the ACF controller, and the startup circuit 100 is disabled to reduce or mitigate leakage after the voltage VAUX is separately regulated by the regulator 430 during steady-state operation of the power converter.

The above examples are merely illustrative of several possible implementations of various aspects of the present disclosure, wherein equivalent alterations and/or modifications will occur to others skilled in the art upon reading and understanding this specification and the annexed drawings. Modifications are possible in the described examples, and other implementations are possible, within the scope of the claims.

What is claimed is:

1. A startup circuit, comprising:
   an enhancement mode transistor, including a drain coupled to a startup circuit input, a source coupled to a first node, and a gate coupled to a second node;
   a current limiting circuit, including:
     a resistor having a first terminal coupled to the first node, and a second terminal coupled to a startup circuit output node to generate a current sense voltage signal at the first node representing a current of a first circuit path through the enhancement mode transistor; and
     a second transistor having a drain coupled to the second node, a source coupled to the startup circuit output node, and a gate coupled to the first node to control a second current path between the second node and the startup circuit output node based on the current

17 sense voltage signal to control an upper limit of the current of the first circuit path; and
a voltage regulation circuit coupled to the startup circuit output node and the second node, and configured to control a voltage of the second node to regulate a startup circuit output voltage of the startup circuit output node.

2. The startup circuit of claim 1, further comprising a precharge circuit, including:
a precharge circuit input coupled to the startup circuit input or to a supply node;
a precharge circuit output coupled to the second node; and
a third transistor or a current source coupled between the precharge circuit input and the second node to provide a current to the second node.

3. The startup circuit of claim 2, wherein:
the precharge circuit includes the third transistor having a drain coupled to precharge circuit input, a source coupled to the precharge circuit output, and a gate coupled to a third node; and
the current limiting circuit comprises a fourth transistor having a drain coupled to the third node, a source coupled to the startup circuit output node, and a gate coupled to the first node.

4. The startup circuit of claim 3, further comprising a blocking circuit, including:
a first blocking transistor having a source coupled to the startup circuit output node, a gate coupled to the second node, and a drain coupled to the second node; and
a second blocking transistor having a source coupled to the startup circuit output node, a gate coupled to the third node and a drain coupled to the third node.

5. The startup circuit of claim 4, wherein the voltage regulation circuit includes:
a voltage source having an output configured to provide a reference voltage signal;
a comparator having:
a non-inverting input coupled to the startup circuit output node;
an inverting input coupled to the output of the voltage source to receive the reference voltage signal; and
an output coupled to a voltage regulation output node;
a fifth transistor, including a gate coupled to the voltage regulation output node, a drain coupled to the second node, and a source coupled to a reference node; and
a sixth transistor, including a gate coupled to the voltage regulation output node, a drain coupled to the third node, and a source coupled to the reference node.

6. The startup circuit of claim 5, wherein:
the enhancement mode transistor, the second transistor, the third transistor, the fourth transistor, the fifth transistor, the sixth transistor, the first blocking transistor, and the second blocking transistor are gallium nitride transistors in a first die; and
the voltage source and the comparator are in a second die.

7. The startup circuit of claim 4, wherein the enhancement mode transistor, the second transistor, the third transistor, the fourth transistor, the first blocking transistor, and the second blocking transistor are gallium nitride transistors.

8. The startup circuit of claim 1, further comprising a blocking circuit, including a blocking transistor having a source coupled to the startup circuit output node, a gate coupled to a second node, and a drain coupled to the second node.

9. The startup circuit of claim 1, wherein the enhancement mode transistor has a drain-to-gate capacitance, and a gate-to-source capacitance, the gate-to-source capacitance being

18 greater than the drain-to-gate capacitance, and a ratio of the gate-to-source capacitance to the drain-to-gate capacitance being less than 1000.

10. The startup circuit of claim 9, wherein the ratio of the gate-to-source capacitance to the drain-to-gate capacitance is greater than 5.

11. A startup circuit, comprising:
an enhancement mode transistor coupled in a first circuit path between a startup circuit input and a startup circuit output node, the enhancement mode transistor including a drain coupled to the startup circuit input, a source coupled to a first node, and a gate coupled to a second node;
a current limiting circuit configured to control a second current path between the second node and the startup circuit output node based on a current sense voltage signal of a resistor in the first circuit path to control an upper limit of a current of the first circuit path; and
a voltage regulation circuit including:
a voltage source having an output configured to provide a reference voltage signal;
a comparator having a non-inverting input coupled to the startup circuit output node, an inverting input coupled to the output of the voltage source to receive the reference voltage signal, and an output coupled to a voltage regulation output node; and
a transistor, including a gate coupled to the voltage regulation output node, a drain coupled to the second node, and a source coupled to a reference node.

12. The startup circuit of claim 11, further comprising a precharge circuit, including:
a precharge circuit input coupled to the startup circuit input or to a supply node;
a precharge circuit output coupled to the second node; and
a transistor or a current source coupled between the precharge circuit input and the second node to provide a current to the second node.

13. The startup circuit of claim 12, wherein:
the precharge circuit includes the transistor having a drain coupled to precharge circuit input, a source coupled to the precharge circuit output, and a gate coupled to a third node; and
the current limiting circuit comprises a transistor having a drain coupled to the third node, a source coupled to the startup circuit output node, and a gate coupled to the first node.

14. The startup circuit of claim 12, wherein the voltage regulation circuit further includes a transistor, including a gate coupled to the voltage regulation output node, a drain coupled to the third node, and a source coupled to the reference node.

15. The startup circuit of claim 11, further comprising a blocking circuit, including a blocking transistor having a source coupled to the startup circuit output node, a gate coupled to a second node, and a drain coupled to the second node.

16. The startup circuit of claim 11, wherein the enhancement mode transistor has a drain-to-gate capacitance, and a gate-to-source capacitance, the gate-to-source capacitance being greater than the drain-to-gate capacitance, and a ratio of the gate-to-source capacitance to the drain-to-gate capacitance being less than 1000.

17. The startup circuit of claim 11, wherein the current limiting circuit comprises:
a resistor having a first terminal coupled to the first node, and a second terminal coupled to the startup circuit output node to generate a current sense voltage signal at the first node representing a current of a first circuit path through the enhancement mode transistor; and a transistor having a drain coupled to the second node, a source coupled to the startup circuit output node, and a gate coupled to the first node.

18. A power conversion system, comprising:

a supply input;

a converter switch coupled to a switch node;

a driver circuit having an output coupled to a control terminal of the converter switch; and a startup circuit, comprising:

a startup circuit input coupled to one of the supply input and the switch node, an enhancement mode transistor coupled in a first circuit path between the startup circuit input and a startup circuit output node, the enhancement mode transistor including a drain coupled to the startup circuit input, a source coupled to a first node, and a gate coupled to a second node, a current limiting circuit configured to control a second current path between the second node and the startup circuit output node based on a current sense voltage signal of a resistor in the first circuit path to control an upper limit of a current of the first circuit path, and a voltage regulation circuit coupled to the startup circuit output node and the second node, and configured to control a voltage of the second node to regulate a startup circuit output voltage of the startup circuit output node.

19. The power conversion system of claim 18, wherein the current limiting circuit comprises:

a resistor having a first terminal coupled to the first node, and a second terminal coupled to the startup circuit output node to generate a current sense voltage signal at the first node representing a current of a first circuit path through the enhancement mode transistor; and a transistor having a drain coupled to the second node, a source coupled to the startup circuit output node, and a gate coupled to the first node.

20. The power conversion system of claim 18, wherein the voltage regulation circuit comprises:

a voltage source having an output configured to provide a reference voltage signal;

a comparator having:

a non-inverting input coupled to the startup circuit output node;

an inverting input coupled to the output of the voltage source to receive the reference voltage signal; and an output coupled to a voltage regulation output node; and a transistor, including a gate coupled to the voltage regulation output node, a drain coupled to the second node, and a source coupled to a reference node.

* * * * *